United States Patent [19]

Ito et al.

[11] Patent Number: 5,098,851
[45] Date of Patent: Mar. 24, 1992

[54] FABRICATING A SEMICONDUCTOR PHOTODETECTOR BY ANNEALING TO SMOOTH THE PN JUNCTION

[75] Inventors: Kazuhiro Ito, Tokyo; Kazuyuki Nagatsuma, Hachioji; Hiroshi Matsuda, Kanagawa; Ichiro Fujiwara, Kawasaki, all of Japan

[73] Assignee: Hitachi, Ltd., Tokyo, Japan

[21] Appl. No.: 474,336

[22] Filed: Feb. 2, 1990

[30] Foreign Application Priority Data

Feb. 10, 1989 [JP] Japan .................. 1-029802

[51] Int. Cl.$^5$ ............................. H01L 31/18
[52] U.S. Cl. ..................... 437/5; 437/154; 437/167; 437/956; 437/987; 148/DIG. 167
[58] Field of Search ............. 437/154, 161, 166, 148, 437/958, 956, 153, 987, 167, 2, 5; 148/DIG. 38, DIG. 39, DIG. 145, DIG. 167

[56] References Cited

U.S. PATENT DOCUMENTS

| | | | |
|---|---|---|---|
| 4,060,427 | 11/1977 | Barile et al. | 437/153 |
| 4,634,474 | 1/1987 | Camlibel et al. | 437/167 |

FOREIGN PATENT DOCUMENTS

| | | | |
|---|---|---|---|
| 0046570 | 4/1981 | Japan . | |
| 0107689 | 6/1983 | Japan | 437/167 |
| 0122721 | 7/1983 | Japan | 437/167 |
| 0191430 | 12/1983 | Japan | 437/148 |
| 0136225 | 6/1986 | Japan | 437/167 |

OTHER PUBLICATIONS

Ando et al., IEEE Journal of Quantum Electronics, vol. QE-20, No. 3 (1984), pp. 256-264.

Primary Examiner—Brian E. Hearn
Assistant Examiner—C. Chaudhari
Attorney, Agent, or Firm—Antonelli, Terry, Stout & Kraus

[57] ABSTRACT

A semiconductor photodetector is disclosed which comprises a pn junction formed in a semiconductor substrate and a pair of electrodes for applying a reverse bias to the pn junction, in which at least a part of the junction plane of the pn junction has been metamorphosed by enhanced diffusion. Hence the pn junction from an outer peripheral portion and a central portion is made smooth.

18 Claims, 4 Drawing Sheets

FABRICATING A SEMICONDUCTOR PHOTODETECTOR BY ANNEALING TO SMOOTH THE PN JUNCTION

BACKGROUND OF THE INVENTION

The present invention relates to a semiconductor photodetector using a compound semiconductor and a method of fabricating such a semiconductor photodetector.

The prior art has been discussed in the IEEE Journal of Quantum Electronics, Vol. QE-20, No. 3 (1984), pp. 256–264. A semiconductor photodetector disclosed by this article is fabricated in such a manner that Zn is diffused into a circular surface region of an n-InP layer having a relatively large diameter and Zn is thereafter diffused again with a relatively deep thickness from the circular surface region into the inside thereof so as to provide a pn junction which has a step-like difference in depth between an outer peripheral portion of the pn junction and a central portion thereof.

Another type of semiconductor photodetector has been disclosed by, for example, JP-B-61-38871.

SUMMARY OF THE INVENTION

In the above-mentioned prior art, no consideration is paid to a control for the amount of step-like difference in depth between the peripheral and central portions of the pn junction as well as a control for the smoothness of the pn junction in each of the peripheral and central portions thereof and the shape of a boundary portion between the peripheral and central portions of the pn junction. Therefore, there are problems that the sufficient prevention of edge breakdown and the prevention or minimization of photo sensitivity of a portion other than a light receiving surface are difficult, the photo sensitivity in the light receiving surface is not uniform, and the multiplification factor is low.

An object of the present invention is to provide a semiconductor photodetector which has better characteristics and to provide a method of fabricating such a semiconductor photodetector.

To attain the above-mentioned object, one aspect of the present invention provides a method of fabrication of a photodetector including a step of depositing a film of a material other than the crystal material of a semiconductor crystal substrate on at least a part of a surface of the semiconductor crystal substrate after a pn junction has been formed in the semiconductor crystal substrate by means of diffusion techniques using a diffusion source of an impurity and heating the resultant structure.

According to another aspect of the present invention, there is provided a semiconductor photodetector comprising a pn junction formed in a semiconductor substrate and a pair of electrodes for applying a reverse bias to the pn junction, characterized in that at least a part of the junction plane of the pn junction has been metamorphosed by enhanced diffusion.

According to a further aspect of the present invention, there is provided a semiconductor photodetector comprising a pn junction formed in a semiconductor substrate and a pair of electrodes for applying a reverse bias to the pn junction, characterized in that the degree of roughness of the junction plane of the pn junction which serves as a light receiving surface is not greater than $\pm 0.05$ $\mu$m.

According to a still further aspect of the present invention, there is provided a semiconductor photodetector comprising a pn junction formed in a semiconductor substrate, the pn junction having a junction plane the depth of which is different between a central portion of the pn junction and a peripheral portion thereof, and a pair of electrodes for applying a reverse bias to the pn junction, characterized in that the dispersion of a photo sensitivity profile at the junction plane in the central portion of the pn junction is not greater than $\pm 10\%$.

Figure 3:
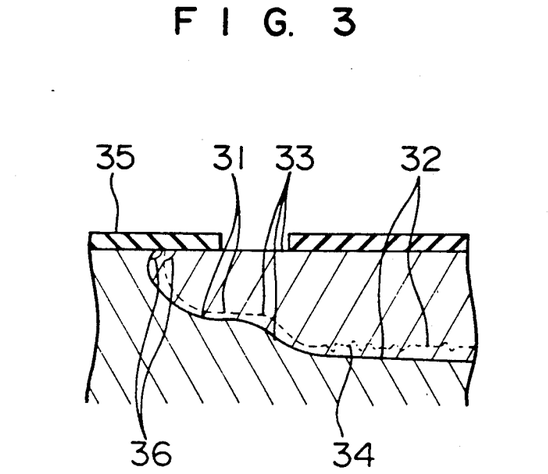
FIG. 3 is a cross section of a part of a semiconductor photodetector which is useful in explaining the shape of a pn junction provided according to the conventional method and that of a pn junction provided according to the present invention.

In the present invention, after a pn junction has been formed in a semiconductor crystal by means of a known thermal diffusion method using a source, a film such as an $SiN_x$ film is deposited in a diffusion window and the resultant structure is subjected to a heat treatment. An interaction produced between the deposited film and the semiconductor crystal owing to the heat treatment causes enhanced diffusion of a p type impurity so that the pn junction formed by the known thermal diffusion method is metamorphosed. The effects of the enhanced diffusion caused by the heat treatment are shown by FIG. 3 in which broken line represents a partial cross section of the pn junction before the heat treatment is conducted and solid line shows that of the pn junction after the heat treatment has been conducted. Namely, there are provided effects that the continuity of a stepped portion 33 of the pn junction which is the boundary between an outer peripheral portion 31 of the pn junction and a central portion 32 thereof is made smooth, small rough portions 34 of the junction plane produced due to crystal defects are eliminated to provide a smooth junction plane, and an angle 36 of the junction plane taken relative to an insulating film 35 is modified to be not smaller than 90°. In a photodetector fabricated by use of only the conventional method, that is, the known diffusion method, there are inconveniences such as edge breakdown which may be caused due to the steepness of a stepped portion of a pn junction and/or the inadequacy of an angle of the pn junction plane relative to an insulating film, and localized breakdown and/or unevenness of photo sensitivity profile which may be produced at small rough or uneven portions of the pn junction plane. In the present invention, on the other hand, the causes for such inconveniences are eliminated, thereby making it possible to easily obtain a semiconductor photodetector which has better characteristics.

DESCRIPTION OF THE PREFERRED EMBODIMENTS

Embodiment 1

Figure 1A:
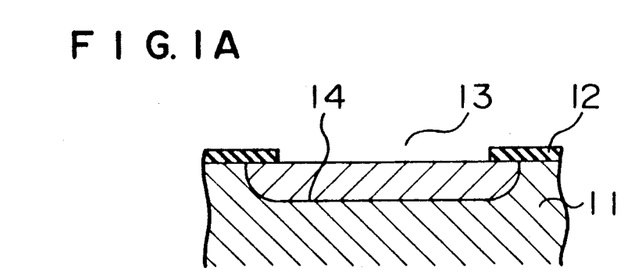
FIGS. 1A to 1C and 2A to 2C are longitudinal cross sections showing semiconductor photodetectors at fabrication process steps according to the present invention.
Figure 1B:
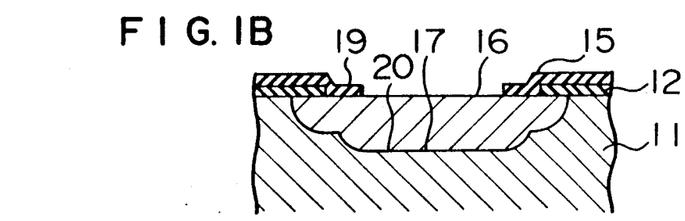
Figure 1C:
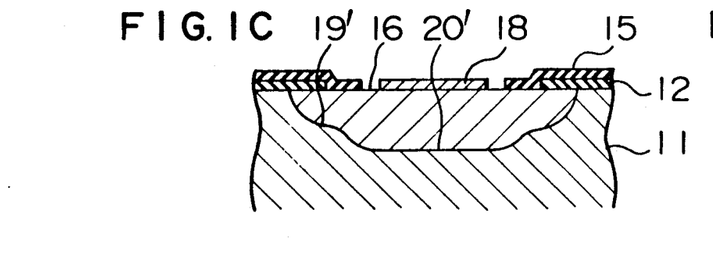

The procedure for fabrication of a semiconductor photodetector according to the present invention will be explained by virtue of FIGS. 1A to 1C which show enlarged cross sections of a portion of the photodetector in the vicinity of a surface thereof at the order of fabrication process steps First, as shown in FIG. 1A, a proper insulating film 12 is deposited on the surface of a semiconductor crystal layer 11 which may be an InP layer having an n⁻ conductivity type. The insulating film 12 may be a well-known insulating film made of, for example, $SiO_2$, PSG, $SiN_x$ or $Al_2O_3$. A circular (optical) window 13 having a proper diameter (for example, 30 to 150 μm) is formed in a portion of the insulating film 12 to expose the semiconductor crystal layer 11. A p type impurity is diffused through the window 13 by means of a known thermal diffusion method using a diffusion source, thereby forming a pn junction 14. Next, an insulating film 15 is deposited, as shown in FIG. 1B. The material of the insulating film 15 may be properly selected from well-known insulating film materials, like the case of the insulating film 12. However, it is preferable that the insulating film 15 is made of a material other than $SiN_x$ in order to minimize a change in depth of the pn junction 14 at a peripheral portion thereof which change may occur in the subsequent impurity diffusing step. A circular window 16 is formed in the insulating film 15. The center of the window 16 substantially coincides with that of the window 13 formed at the step explained in conjunction with FIG. 1A but the diameter of the window 16 is smaller than that of the window 13. A p type impurity is diffused through the window 16 by means of a known thermal diffusion method to form a pn junction 17 which reaches a position deeper than the pn junction 14 formed at the step explained in conjunction with FIG. 1A. Namely, a pn junction is formed which is deeper at a central portion 20 than an outer peripheral portion 19. Next, as shown in FIG. 1C, an insulating film 18 is deposited in the window 16. An $SiN_x$ film is used as the insulating film 18. The insulating film 18 is deposited in only a central portion of the window 16 or over the whole of the window 16. The insulating film 18 may extend to lie on the insulating film 15. After the insulating film 18 has been deposited, the crystal wafer or the resultant structure is subjected to a heat treatment at a predetermined proper temperature for a predetermined proper time. In the heat treatment, no source of p type impurity is required in the atmosphere. The atmosphere may be $H_2$, $N_2$, an inert gas such as Ar, a V-group element gas, the mixture of a V-group element gas and an inert gas, or a vacuum. As a modification of the above embodiment may be employed a method in which in each step the insulating formed in the preceding step is entirely or partially removed and a new insulating film is thereafter deposited again.

Embodiment 2

Figure 2A:
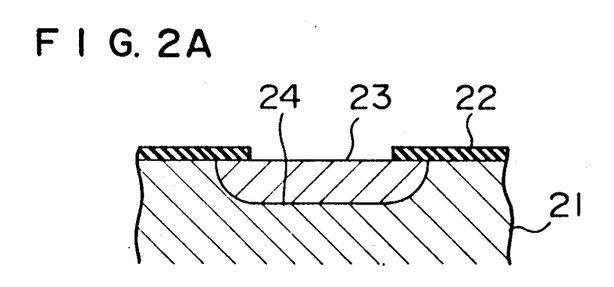
Figure 2B:
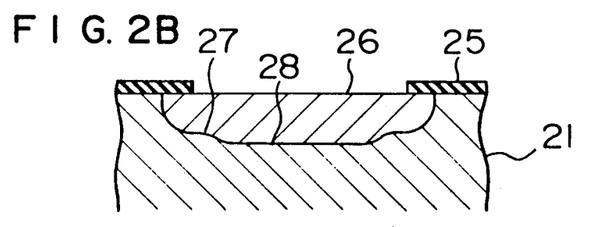
Figure 2C:
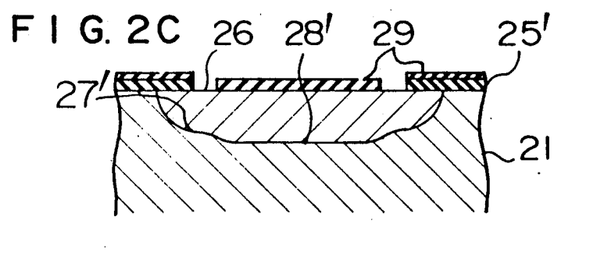

FIGS. 2A to 2C show a method of fabrication of a semiconductor photodetector according to another embodiment of the present invention. In FIG. 2A, reference numeral 21 designates a semiconductor crystal layer which has an n⁻ conductivity type, numeral 22 an insulating film (which is most preferably made of $SiN_x$ but may be made of $SiO_2$, PSG or $Al_2O_3$), and numeral 23 a circular window. A p type impurity is diffused through the window 23 by means of a known thermal diffusion method to form a pn junction 24. In FIG. 2B, reference numeral 25 designates the insulating film 22 itself deposited at the step explained in conjunction with FIG. 2A or a newly deposited insulating film which may be made of a material of the same or different kind as or than that of the insulating film 22 (but which is most preferably made of $SiN_x$), and numeral 26 designates a window. The window 26 is substantially concentrical with the window 23 shown in FIG. 2A but has a larger diameter than the window 23. A p type impurity is diffused through the window 26 by means of a known thermal diffusion method. By this diffusion is provided a pn junction the depth of which is shallow at an outer peripheral portion 27 of the pn junction and deep at a central portion 28 thereof. In FIG. 2C, reference numeral 25' designates an insulating film which may be the insulating film 25 itself shown in FIG. 2b or a newly deposited insulating film, and numeral 29 designates an insulating film which may be made of $SiN_x$. The insulating film 29 is deposited in a central portion of the window 26 or over the whole of the window 26. The insulating film 29 may extend to lie on the insulating film 25'. The resultant structure is subjected to a heat treatment similar to that explained in conjunction with the Embodiment 1 shown in FIGS. 1A to 1C.

In the foregoing, the p type impurity is most preferably Zn but may be Mg, Be or Li. The semiconductor crystal may be Inp, GaAs, GaAlAs, GaSb, GaAlSb, InGaAs, InGaAsP, InAlAs, or the like.

Embodiment 3

Figure 4:
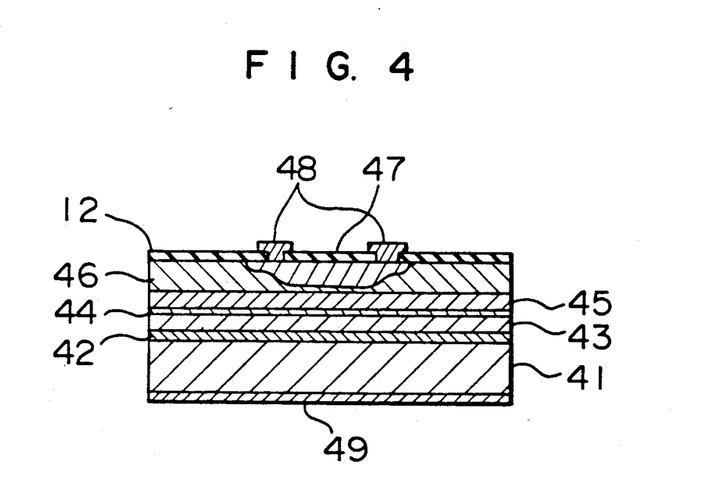
FIG. 4 is a longitudinal cross section of an embodiment of a semiconductor photodetector according to the present invention.

The present embodiment provides a semiconductor photodetector shown in FIG. 4. A method of fabrication of the device will now be explained in detail.

There was used a semiconductor crystal including an InP layer 42 (having an impurity concentration of $1 \times 10^{15}$ cm⁻³, an n conductivity type and a thickness of 1 μm), an InGaAs layer 43 ($1 \times 10^{15}$ cm⁻³, n type and 2 μm), an InGaAsP layer 44 ($5 \times 10^{15}$ cm⁻³, n type and 0.2 μm), an n InP layer 45 ($3 \times 10^{16}$ cm⁻³, n type and 0.7 μm) and an n-InP layer 46 ($1 \times 10^{15}$ cm⁻³, n type and 6 μm) which were successively grown on an InP substrate 41 ($5 \times 10^{18}$ cm⁻³ and n type). The following explanation will be made while using partially FIGS. 1A to 1C. An $SiN_x$ film having a thickness of 1000 Å and an $SiO_2$ film having a thickness of 2000 Å were successively laminated on a surface of the n⁻InP layer 46. The n⁺InP layer 45 and the n⁻InP layer 46 shown in FIG. 4 correspond to the semiconductor crystal layer 11 shown in FIG. 1A, and reference numeral 12 in FIG. 4 designates the lamination of the $SiN_x$ film and the $SiO_2$ film which corresponds to the insulating film 12 shown in FIG. 1A. Next, a part of the insulating film 12 was removed to form a circular window 13 (having a diameter of 80 μm). This sample or the resultant structure was vacuum-enclosed together with a $ZnP_2$ powder into a quartz ampule and was heated at 550° C. for about 22 minutes to form a pn junction 14 (having a depth of 4 μm). Next, as shown in FIG. 1B, a PSG film 15 was deposited with a thickness of 3000 Å and a part of the PSG film 15 was removed to form a window 16 (having a diameter of 65 μm). The resultant structure was vacuum-enclosed together with a $ZnP_2$ powder into a quartz ampule and was heated at 550° C. for 16 minutes to form a pn junction 17 (the depth of which is 4 μm at an outer peripheral portion 19 of the pn junction and 5.3 μm at a central portion 20 thereof). Thereafter, as shown in FIG. 1C, an SiN$_x$ film 18 (having a thickness of 1600 Å) was deposited over a diameter of 55 μm in a central portion of the window 16. The resultant structure was heated in H$_2$ at 430° C. for 19 minutes so that the pn junction has a depth which is 4.2 μm at an outer peripheral portion 19' of the pn junction and 5.5 μm at a central portion 20' thereof. Next, known steps including an electrode forming step and a scribing step were conducted to provide a device shown in FIG. 4. In FIG. 4, reference numeral 47 designates the pn junction, numeral 48 a p type electrode (having a ring form), and numeral 49 an n type electrode. When a reverse bias was applied between the electrodes 48 and 49 and the device was irradiated with light having a wavelength of 1.3 μm and a power of 1 μW, the device exhibited an avalanche breakdown at a voltage of 80 to 90 V and the maximum multiplification factor reached 60. The photodetector device was scanned with focused light to measure the multiplification factor. The dispersion of a multiplification factor profile (or photo sensitivity profile) in a light receiving surface, that is, an inner region defined by the inner diameter of the electrode 48 was not greater than ±10% or was extremely uniform while the photo sensitivity of an outer region defined by the outer diameter of the electrode 48 was not greater than 5% of that of the inner region defined by the inner diameter of the electrode 48 or was negligible. As a result, it was confirmed that the device has characteristics which are better as a photodetector. The yield rate was not lower than 80%. On the other hand, in the case of the conventional device fabricated by a process which does not rely on the method according to the present invention, that is, a process in which only usual thermal diffusion methods are used for the formation of a pn junction, the device exhibited a breakdown voltage of 70 to 80 V. Also, a photo sensitivity profile of the conventional device in the inner region defined by the inner diameter of the electrode 48 exhibited a dispersion of about ±20%. Further, there were many inferior devices having an increased photo sensitivity at the boundary or stepped portion between the peripheral and central portions of the pn junction 47 or in the vicinity of a portion of the peripheral portion of the pn junction 47 adjoining the insulating film and hence the yield rate for good devices was not higher than 5%. Furthermore, the highest value of the maximum multiplification factor available by the conventional fabrication method was 40. As a result, it was ascertained that the method according to the present invention make it possible to fabricate a device having better characteristics with a high yield rate. Such an effect of the present invention may be considered to result from the fact that the above-mentioned heat treatment step causes the metamorphosis of the pn junction or the rediffusion of impurity at the pn junction by enhanced diffusion, thereby making small a difference in depth between the central and peripheral portions of the pn junction plane, suppressing the degree of roughness of small rough portions in the pn junction plane to a value not greater than ±0.05 μm or making the pn junction plane smooth, and optimizing the angle of the pn junction plane relative to the surface of the semiconductor crystal substrate to be 90° to 110°.

Embodiment 4

In the present embodiment, a semiconductor photodetector was fabricated using the same semiconductor crystal as that in the Embodiment 3. Steps of fabrication of the photodetector will be explained by virtue of FIGS. 2A to 2C. First, as shown in FIG. 2A, an SiN$_x$ film 22 (having a thickness of 1000 Å) was deposited on a surface of the semiconductor crystal and a circular window 23 having a diameter of 70 μm was thereafter formed in the SiN$_x$ film 22. Zn was diffused by means of a known thermal diffusion method (at a temperature of 550° C. for 35 minutes) utilizing an ampule having a source of ZnP$_2$ to form a pn junction 24 (having a depth of 4.5 μm). Next, as shown in FIG. 2B, the window 23 of the SiN$_x$ film deposited in FIG. 2A was enlarged to provide a window 26 (having a diameter of 80 μm). Zn was diffused by means of a known thermal diffusion method (at a temperature of 550° C. for 22 minutes). The pn junction resulted in a shape having a depth which is 5.3 μm at a central portion 28 of the pn junction and 4.0 μm at an outer peripheral portion 27 thereof. Next, as shown in FIG. 2C an SiN$_x$ film 29 (having a thickness of 1600 Å) was deposited and a ring-like portion of the SiN$_x$ film 26 concentrical with the window 26 and having an inner diameter of 60 μm and an outer diameter of 70 μm was removed. Only this sample of the resultant structure was vacuum-enclosed into an ampule and was heated at a temperature of 450° C. for 19 minutes. As a result, an outer peripheral portion 27' of the pn junction had a depth of 4.2 μm and a central portion 28' thereof has a depth of 5.5 μm. Subsequently, steps including an electrode forming step and a scribing step were conducted like the case of the Embodiment 3 to complete a photodetector device. The results of measurement of characteristics were quite similar to those in the Embodiment 3 and the yield rate for good devices was not lower than 80%. On the other hand, in the case of the conventional device fabricated by a process which does not rely on the method according to the present invention, that is, a process in which only known thermal diffusion methods are used for the formation of a pn junction, there were many inferiors including the unevenness of a photo sensitivity profile in an inner region defined by the inner diameter of a ring-like p type electrode and the increase of photo sensitivity in the vicinity of an outer peripheral portion of the pn junction caused by edge breakdown and hence the yield rate for good devices was in the order of 3%. As a result, it was ascertained that a very high yield rate for good devices is attainable by the method according to the present invention. It was confirmed that a similar result is obtained when the depth of a central portion of a pn junction fabricated using a diffusion source is deeper than that of a peripheral portion thereof by 0.2 μm (preferably, 0.4 μm) or more.

Embodiment 5

Figure 5A:
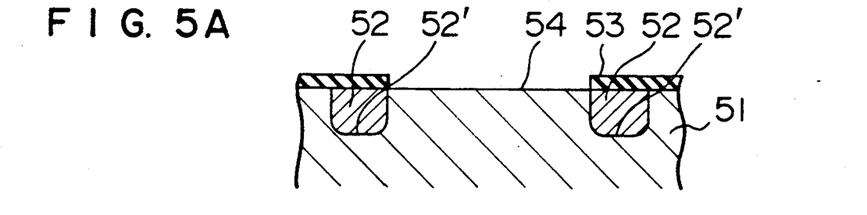
FIGS. 5A to 5D and 6A and 6B are longitudinal cross sections showing semiconductor photodetectors at fabrication process steps according to the present invention.
Figure 5B:
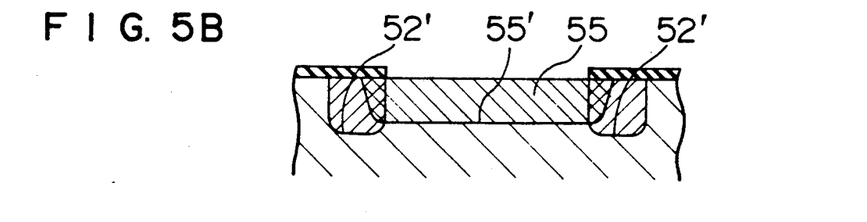
Figure 5C:
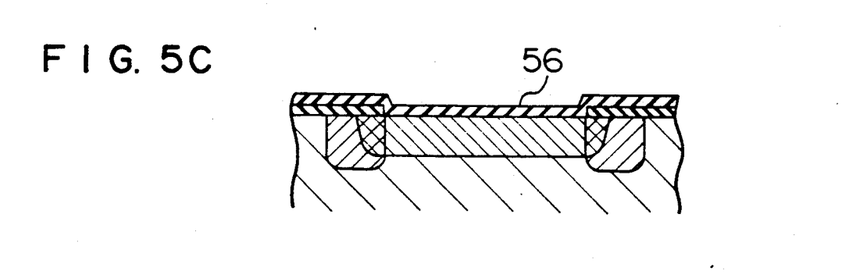
Figure 5D:
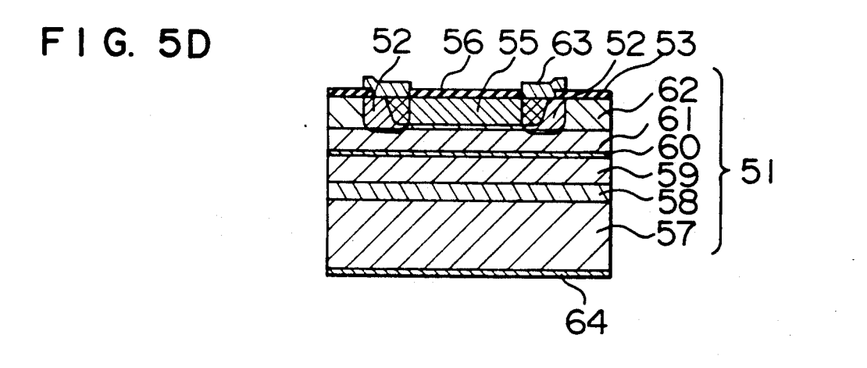

The present embodiment will be explained by virtue of FIGS. 5A to 5D. In FIG. 5A, reference numeral 51 designates a semiconductor crystal for fabrication of a semiconductor photodetector. The crystal 51 is similar to that used in the Embodiment 3 but different therefrom only in that the thickness of the uppermost n$^-$InP layer is 2.5 μm and the thickness of the n$^+$Inp layer is 1.1 μm. Any further explanation of the crystal 51 will be omitted. Reference numeral 52 designates a p type region which contains Be as an impurity. The p type region 52 has a ring form, the outer and inner diameters of which are 80 μm and 50 μm, respectively. The depth of the p type region 52 is 2.5 μm. Numeral 52' designates a pn junction formed between the p type region 52 and the semiconductor crystal 51, and numeral 53 designates an $SiN_x$ film which has a window 54 having a diameter of 50 μm. Zn was diffused through the window 54 by means of a known diffusion method to obtain a structure shown in FIG. 5B. In FIG. 5B, reference numeral 55 designates a p type region formed by the diffusion of Zn. A portion of the p type region 55 extends to lie on the p type region 52 containing Be. The depth of a pn junction 55' formed by the diffusion of Zn was 1.8 μm. Next, an $SiN_x$ film 56 was deposited again to obtain a structure shown in FIG. 5C. The structure having the deposited $SiN_x$ film 56 was heated in $H_2$ at 450° C. for 15 minutes. As the result of this heat treatment, Zn in the p type region 55 was subjected to enhanced diffusion to a depth of 2.0 μm. As the results of the known thermal diffusion of Zn and the heat treatment, Be in the p type region 52 was extended to a depth of 2.7 μm. Subsequently, known steps including an electrode forming step and a scribing step were conducted to obtain a structure shown in FIG. 5D. The semiconductor crystal 51 shown in FIG. 5D includes a substrate 57, an InP layer 58, an InGsAs layer 59, an InGaAsP layer 60, an $n^+$InP layer 61 and an $n^-$InP layer 62. In FIG. 5O, reference numeral 52 designates the p type region containing Be, numeral 55 the p type region containing Zn, numeral 63 a ring-like p type electrode, numeral 64 an n type electrode, and numerals 53 and 56 the $SiN_x$ films. When the resultant device was irradiated at the $SiN_x$ film 56 with light having a wavelength of 1.3 μm and a power of 1 μW and a reverse bias was applied between the electrodes 63 and 64, the device exhibited a breakdown voltage of 80 V ±5 V and the maximum multiplification factor reached 40. The dispersion of a multiplification factor profile in a light receiving surface, that is, an inner region defined by the inner diameter of the ring-like electrode 63 was small or not greater than ±10% and the yield rate was not lower than 70%. On the other hand, in the case of the conventional device fabricated by a process which does not rely on the method according to the present invention, that is a process in which the enhanced diffusion after the deposition of the $SiN_x$ film is not conducted, the dispersion of a multiplification factor profile was ±30%. In other words, the pn junction plane involved a remarkably multiplicity of roughnesses. A breakdown voltage of the conventional device was 75 V ±10 V and the yield rate was not higher than 5%.

Embodiment 6

Figure 6A:
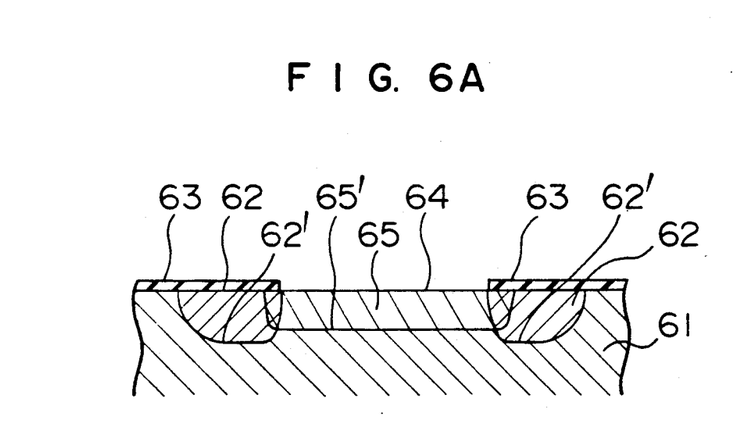
Figure 6B:
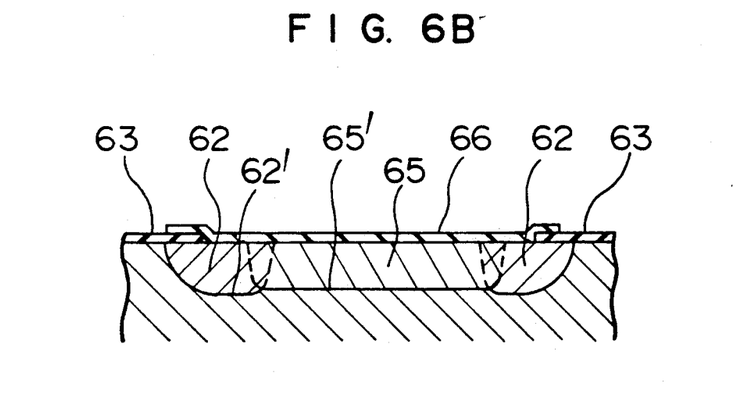

The present embodiment will be explained by virtue of FIGS. 6A and 6B. In FIG. 6A, reference numeral 61 designates a semiconductor crystal for fabrication of a semiconductor photodetector. Since the specification of the crystal 61 is substantially similar to that used in the Embodiment 3, further explanation thereof will be omitted. Reference numeral 62 designates a p type region which contains Zn as an impurity and has a graded impurity concentration profile. The p type region 62 has a ring form having an outer diameter of 70 μm. The depth of a pn junction 62' formed between the p type region 62 and the semiconductor crystal 61 is 6.2 μm. Numeral 63 designates an insulating film having a window 64 which is concentric with the ring-like p type region 62 and which has a diameter of 50 μm. Numeral 65 designates a p type region which is formed by diffusing Zn through the window 64 and which has an abrupt impurity concentration profile. The depth of a pn junction 65' formed between the p type region 65 and the semiconductor crystal 61 is 5.9 μm. Next, as shown in FIG. 6B, the window 64 of the insulating film 63 was enlarged to have a diameter of 65 μm. Further, a film 66 mainly containing $SiN_x$ was deposited and the resultant structure was heated in $H_2$ at a temperature of 550° C. for 10 minutes. As a result, the depth of the p type region 62 having the graded impurity concentration profile reached 6.4 μm and the depth of the p type region 65 having the abrupt impurity concentration profile reached 6.1 μm. Subsequently, the structure was processed through known steps to complete a photodetector. The thus fabricated device exhibited a breakdown voltage of 60 V±3 V. The dispersion of a multiplification factor profile was not greater than ±5%, that is, a very satisfactory multiplification factor profile was obtained. The yield rate was not lower than 70%. On the other hand, in the case of the conventional device fabricated by a process which does not rely on the method according to the present invention, that is, a process in which the heat treatment after the deposition of the $SiN_x$ film 66 shown in FIG. 6B is not conducted, the dispersion of a multiplification factor profile was ±35% and a breakdown voltage was 50 V±10 V. Namely, each of the multiplification factor profile and the breakdown voltage exhibited a remarkable dispersion. Further, the yield rate was not higher than 5%.

Embodiment 7

In the present embodiment, a semiconductor photodetector was fabricated in a manner which is similar to the Embodiment 6 but different therefrom only in that the depth of a region (62 in FIG. 6A) of a pn junction having a graded impurity concentration profile is 5.9 μm. The results obtained by the present embodiment were similar to those obtained by the Embodiment 6. Accordingly, it was ascertained that the method according to the present invention is effective irrespective of a relative difference (in depth) between the peripheral and central portions of a pn junction.

According to the present invention, defects of a pn junction fabricated by means of a known thermal diffusion method, that is, small rough portions produced due to crystal defects, the sharpness of a stepped portion of the pn junction (or a boundary between junction portions having different depths) and the inadequacy of an angle of the pn junction relative to an insulating film are eliminated or minimized so that the roughness is made smooth or small, the sharpness of the boundary between junction portions having different depths is moderated and the angle of the pn junction relative to the insulating film is optimized. Thereby, there are provided effects that an edge breakdown of the photodetector is prevented, a photo sensitivity profile thereof is made uniform and the maximum multiplification factor thereof is increased. As a result, a low-noise and high-sensitivity photodetector can be fabricated with a high yield rate.

The effect of the present invention can be obtained irrespective of a relationship in position or depth between the edge portion and the central portion of a pn junction. A semiconductor crystal material used may include a III-V group compound semiconductor in addition to GaAs, GaSb and InAs group compound semiconductor. An impurity used may be Cd, Mg or the like in addition to Zn and Be.

We claim:

1. A method of fabricating a semiconductor photodetector comprising the subsequent steps of:
   diffusing impurities into a semiconductor substrate to form a pn junction in said semiconductor substrate;
   depositing a film made of a material different from said semiconductor substrate on a surface region of said semiconductor substrate above at least a central portion of said pn junction of said semiconductor substrate; and
   re-diffusing said impurities diffused into said semiconductor substrate in said semiconductor substrate by annealing to make a rugged boundary plane of said pn junction even.

2. A method of fabricating a semiconductor photodetector comprising the subsequent steps of:
   diffusing impurities from a surface of a semiconductor substrate into said semiconductor substrate to form a pn junction of which depths are different between a central portion and a peripheral portion in said semiconductor substrate;
   depositing a film made of a material different from said semiconductor substrate on at least a surface region of said semiconductor substrate above said central portion; and
   annealing said semiconductor substrate.

3. A method of fabricating a semiconductor photodetector according to claim 2, wherein the depth of said pn junction formed in said central portion is larger than that of said peripheral portion.

4. A method of fabricating a semiconductor photodetector according to claim 2, wherein the depth of said pn junction formed in said central portion is larger than that of said peripheral portion by more than 0.2 μm.

5. A method of fabricating a semiconductor photodetector according to claim 2, wherein the depth of said pn junction formed in said peripheral portion is larger than that of said central portion.

6. A method of fabricating a semiconductor photodetector according to claim 2, wherein said material is $SiN_x$.

7. A method of fabricating a semiconductor photodetector according to claim 3, wherein said film is deposited only over said central portion and not over said peripheral portion.

8. A method of fabricating a semiconductor photodetector comprising the subsequent steps of:
   diffusing impurities from a surface of a semiconductor substrate into said semiconductor substrate to form a pn junction of which depths are different between a central portion and a peripheral portion;
   depositing a film made of a material different from said semiconductor substrate on at least a surface region of said semiconductor substrate above at least said central portion of said pn junction of said semiconductor substrate; and
   re-diffusing said impurities diffused into said semiconductor substrate in said semiconductor substrate by annealing.

9. A method of fabricating a semiconductor photodetector according to claim 8, wherein the depth of said pn junction formed in said central portion is larger than that of said peripheral portion.

10. A method of fabricating a semiconductor photodetector according to claim 8, wherein the depth of said pn junction formed in said central portion is larger than that of said peripheral portion by more than 0.2 μm.

11. A method of fabricating a semiconductor photodetector according to claim 8, wherein the depth of said pn junction formed in said peripheral portion is larger than that of said central portion.

12. A method of fabricating a semiconductor photodetector according to claim 8, wherein said material is $SiN_x$.

13. A method of fabricating a semiconductor photodetector according to claim 9, wherein said film is deposited only over said central portion and not over said peripheral portion.

14. A method of fabricating of a semiconductor photodetector comprising the subsequent steps of:
   forming a pn junction in a semiconductor crystal substrate by means of a diffusion method using a different source of impurity, wherein a central portion of said pn junction is formed at a position which is deeper than that of a peripheral portion of said pn junction by 0.2 μm or more; and
   depositing a film of a material other than the crystal material of said semiconductor crystal substrate on at least a part of a surface of said semiconductor crystal substrate above said central portion of said pn junction and heating the resultant structure.

15. A method of fabricating a semiconductor photodetector according to claim 14, wherein said film of the material other than the crystal material of said semiconductor crystal substrate includes an $SiN_x$ film.

16. A method of fabrication of a semiconductor photodetector comprising the subsequent steps of:
   diffusing into an n type semiconductor substrate a p type impurity by means of a diffusion source thereof through a first window which is formed in an insulating film provided on said n type semiconductor substrate;
   depositing a film of a material other than $SiN_x$ on the resultant structure and forming in said film of the material other than $SiN_x$ a second window the area of which is smaller than that of said first window;
   diffusing into said n type semiconductor substrate a p type impurity by means of a diffusion source thereof through said second window to form a pn junction the depth of which is deeper than that of a pn junction formed through said first window; and
   depositing a film of a material other than the crystal material of said n type semiconductor substrate in at least a central portion of said second window and heating the resultant structure.

17. A method of fabrication of a semiconductor photodetector comprising the subsequent steps of:
   diffusing into an n type semiconductor substrate a p type impurity by means of a diffusion source thereof through a first window which is formed in an insulating film provided on said n type semiconductor substrate;
   enlarging said first window to provide a second window the area of which is larger than that of said first window;
   diffusing into said n type semiconductor substrate a p type impurity by means of a diffusion source thereof through said second window; and
   depositing a film of a material other than the crystal material of said n type semiconductor substrate in at least a central portion of said second window and heating the resultant structure.

18. A method of fabrication of a semiconductor device comprising the subsequent steps of:
forming a diffused region to form a pn junction in a semiconductor crystal substrate by means of a diffusion method using a diffusion source of impurity;
depositing a film of a material other than the crystal material of said semiconductor crystal substrate on at least a central portion of the diffused region of a surface of said semiconductor crystal substrate; and
heating the resultant structure without using the diffusion source thereby to make smooth a surface of the pn junction.

* * * * *